United States Patent [19]

Barber et al.

[11] 4,034,306
[45] July 5, 1977

[54] D.C. AMPLIFIER FOR USE WITH LOW SUPPLY VOLTAGE

[75] Inventors: Herbert Douglas Barber, Dundas; Gary Curtis Salter, Burlington, both of Canada

[73] Assignee: Linear Technology Inc., Burlington, Canada

[22] Filed: Apr. 16, 1976

[21] Appl. No.: 677,632

[52] U.S. Cl. .............................. 330/30 D; 330/22; 330/28
[51] Int. Cl.[2] ......................................... H03F 3/45
[58] Field of Search ................. 330/19, 22, 28, 29, 330/30 D, 38 M, 40

[56] References Cited
UNITED STATES PATENTS

| | | | |
|---|---|---|---|
| 3,077,566 | 2/1963 | Vosteen | 330/30 D |
| 3,801,923 | 4/1974 | Russell et al. | 330/38 M X |
| 3,904,972 | 9/1975 | Seki et al. | 330/30 D X |

*Primary Examiner*—James B. Mullins
*Attorney, Agent, or Firm*—Rogers, Bereskin & Parr

[57] ABSTRACT

An integrated circuit direct coupled amplifier capable of operating from a single battery cell, has: a differential amplifier input stage having an input transistor and a second transistor; an intermediate gain stage; and an output stage. Signal is fed back from the output stage to the base of the second transistor of the differential amplifier, through a negative feedback circuit. Current sources are connected as loads in the collector circuits of the input transistor of the differential amplifier and the transistor of the intermediate gain stage. The current sources are biased by separate bias sources, to improve stability. The bias source for the intermediate gain stage current source also biases a current source for the feedback circuit. A starting circuit is connected to the bias source for the intermediate gain stage and provides self starting for the current sources. Frequency compensation elements are located in the base-collector circuit of the intermediate gain stage transistor to stabilize the amplifier, and a gain control resistor connected to the base of the second transistor of the differential stage operates by varying the negative feedback in the amplifier.

7 Claims, 7 Drawing Figures

D.C. AMPLIFIER FOR USE WITH LOW SUPPLY VOLTAGE

This invention relates to a low level, low power, high gain amplifier which is direct coupled and is able to operate from very low supply voltages. The amplifier is particularly suited for use in hearing aids.

A device such as a hearing aid requires a high gain amplifier which can operate from a single battery cell of voltage typically between 1.0 and 1.5 volts. In addition, because of the very small space available in a hearing aid, the amplifier should be capable of being fabricated on a single monolithic chip, with as few external components as possible. The need for a single monolithic chip requires that the amplifier be direct coupled, since capacitors large enough for AC coupling cannot be fabricated on a very small chip. The requirement for direct coupling, together with the very low supply voltage available, adds the constraint that there can never be two transistor base-emitter junctions in series across the supply voltage, since the combined voltage drop across the two junctions would approach that of the supply voltage.

In view of these constraints, the design of a high gain integrated circuit direct coupled amplifier suitable for devices such as hearing aids has been a difficult task. A major problem in such amplifiers has been stability, particularly when a portion of the output signal is fed back subtractively to the input to control gain (a gain control, perferably a feedback gain control, is desirably provided in devices such as hearing aids). Because of the instability problems, only a limited feedback gain control range has been possible in prior art amplifiers, a serious disadvantage.

According to the invention, a high gain direct coupled integrated circuit amplifier is provided, capable of operating at a very low supply voltage, and capable of accepting a feedback type gain control operative over a wide range while retaining amplifier stability. The amplifier of the invention typically includes three stages, namely a differential amplifier stage having an input transistor and a second transistor; an intermediate amplifying stage having a third transistor, and an output stage. Signal is fed back from the output stage to the second transistor of the differential stage, through a feedback circuit, to provide negative feedback for the amplifier. In one embodiment current sources are connected as loads for the first and third transistors and are biased by separate bias sources, to improve stability. In such embodiment the bias source for the third transistor also biases a current source for the feedback circuit, and a starting circuit is connected to the bias source for the third transistor. Frequency compensation elements are connected to the input of the third transistor, to stabilize the amplifier. The gain of the amplifier can be varied over a relatively wide range by varying the negative feedback to the second transistor, without causing instability.

Further objects and advantages of the invention will appear from the following description, taken together with the accompanying drawings, in which.

Figure 1:
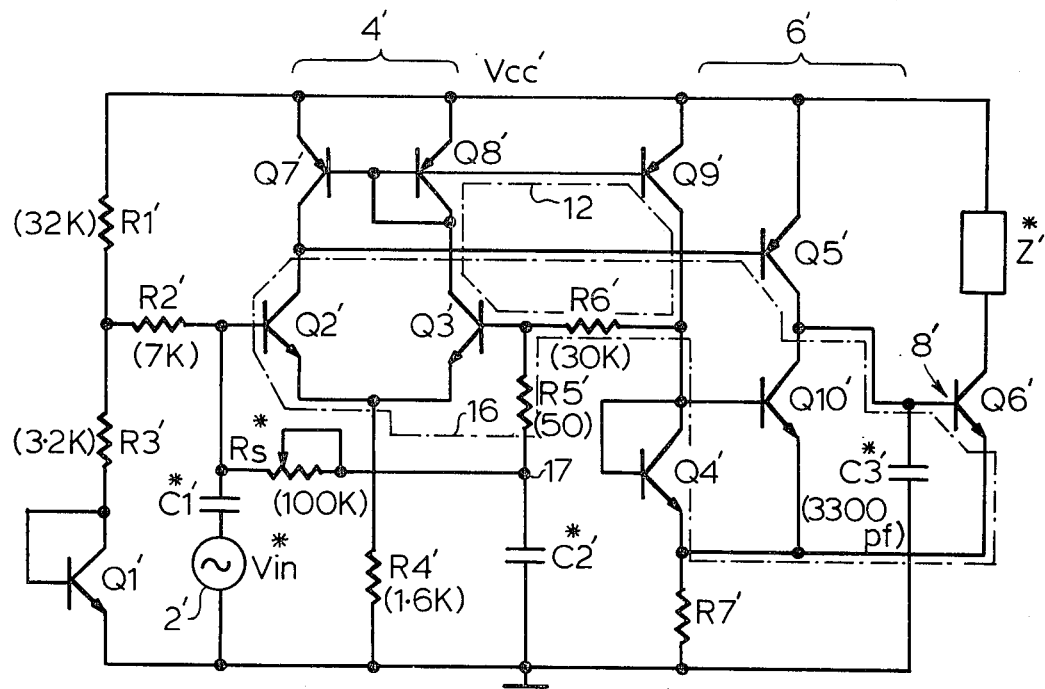
FIG. 1 is a circuit diagram showing a prior art direct coupled amplifier used with low supply voltages.
Figure 2:
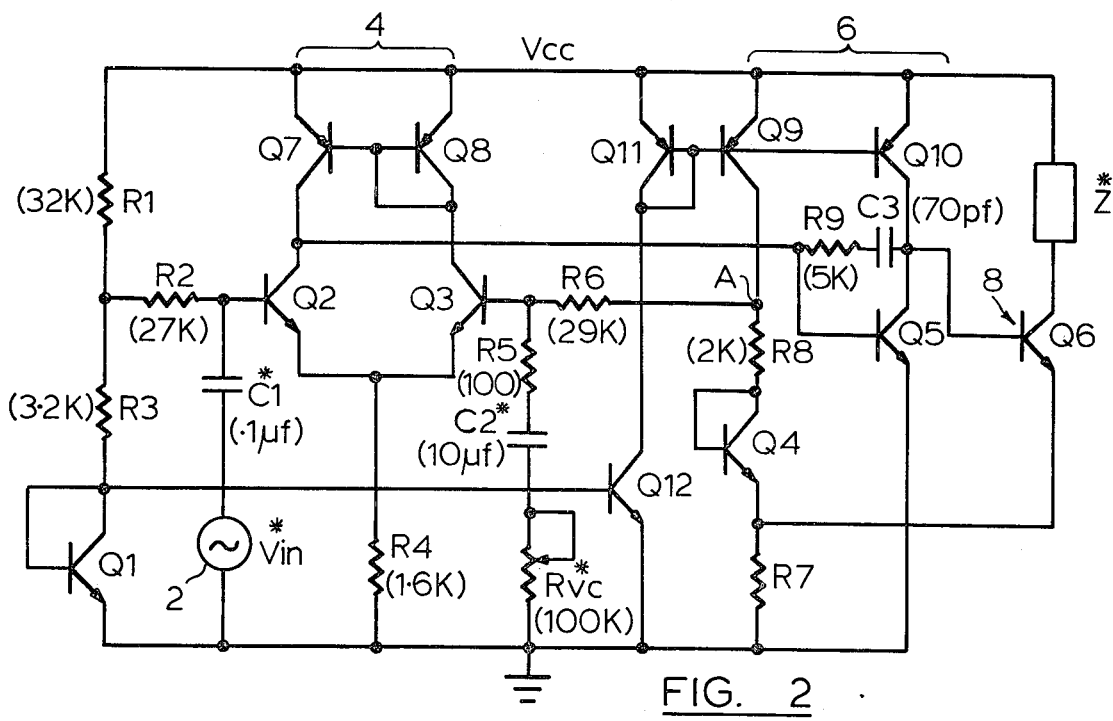
FIG. 2 is a circuit diagram of an amplifier according to the present invention.

In the drawings, the same reference numerals are used to indicate corresponding parts in FIGS. 1, which shows a prior art circuit which has severe disadvantages to be discussed, and in FIG. 2, which shows a circuit according to the present invention. However, primes have been used to distinguish the parts in FIG. 1 from those of FIG. 2. In addition, external components, i.e., those not fabricated as an integral part of the integrated circuit chip, are indicated by an asterisk in FIGS. 1 and 2. Typical component values for the two circuits appear in parenthesis beside the components.

The following general description is given with respect to the circuit of FIG. 2, but also applies to the circuit of FIG. 1. As shown, the FIG. 2 circuit receives its input signal $V_{in}$ from an input transducer 2. This signal is amplified in three series connected amplifying stages 4, 6 and 8, and the resultant amplified signal is delivered to a load Z. Power for the amplifier is supplied from a single battery cell (not shown), the positive terminal of which supplies voltage Vcc and the negative terminal of which is indicated as ground.

The first amplifying stage 4 of the amplifier is a differential stage which provides both high gain and the differencing point of a feedback loop to be described. The stage 4 includes two transistors Q2 and Q3 having their emitters connected together and through a resistor R4 to ground. Collector current for transistor Q3 is supplied through diode connected transistor Q8. Collector current for transistor Q2 is supplied by a current source constituted by transistor Q7, which forms an active load for transistor Q2. This results in very high voltage gain for transistor Q2. The current source constituted by transistor Q7 is biased from transistor Q8.

The input signal $V_{in}$ is fed through an external capacitor C1 to the base of transistor Q2. Transistor Q2 is biased by a circuit consisting of resistors R1 and R3 in series with diode connected transistor Q1, and resistor R2 connected between the junction of resistors R1, R3 and the base of transistor Q2. Resistor R2 effectively sets the input impedance of the amplifier.

Input signal $V_{in}$ is amplified by transistor Q2 in stage 4 (transistor Q2 has a high voltage gain). The amplified signal is fed from the collector of transistor Q2 to the second amplifying stge 6, and specifically, to the base of transistor Q5 of the second stage. Again an active load, constituted by current source transistor Q10, is connected in the collector circuit of transistor Q5 to provide high voltage gain. Transistor Q10 is biased by diode connected transistor Q11 in the FIG. 2 circuit (in the FIG. 1 circuit, transistor Q10' is biased by a diode connected transistor Q4', which is part of the negative feedback loop, as will be described).

The amplified signal at the collector of transistor Q5 is fed to the base of transistor Q6 of the third or output stage 8. Transistor Q6 provides additional amplification. The load Z is connected to the collector of transistor Q6 to receive the resultant signal.

Negative feedback is provided by sampling the signal from the emitter of transistor Q6, shifting its DC level by an appropriate amount by diode connected transistor Q4, and then feeding the shifted signal back through resistors R6, R8 (resistor R6' alone in the FIG. 1 circuit) to the base of transistor Q3.

The circuit of FIG. 1 has a number of serious disadvantages. One major disadvantage is that the FIG. 1 circuit cannot accept a wide range feedback type gain control. When such a control was used and the gain was varied over even a narrow range, instability (oscillations) resulted, indicating that the loop gain of the amplifier was greater than one at the frequency at which a 180° phase shift occurred in the loop gain. Wide range distortion-free volume control was therefore not possible in the FIG. 1 circuit. The FIG. 1 circuit has still further disadvantages, which will be referred to presently.

The FIG. 2 circuit differs from the FIG. 1 circuit in several important respects, which have overcome the disadvantage referred to above. The major differences, summarized briefly, include the following.

1. The current source transistor Q9 is separately biased by the diode connected transistor Q11, rather than being biased by transistor Q8' as in FIG. 1. This has several important results, to be described shortly.

2. The external starting resistor $R_s$ required in the FIG. 1 circuit has been eliminated and a self starting circuit has been provided, as will be described.

3. Frequency compensation elements, namely resistor R9 and capacitor C3, have been added in a specific location, namely the base-collector circuit of transistor Q5.

4. The features (1) to (3) described above have made possible the addition of a stable feedback type gain control, constituted by resistor $R_{vc}$.

Other differences between the two circuits will be explained after the above four features have been explained in more detail.

Concerning the separate biasing of transistor Q9, it will be seen that in FIG. 1, transistor Q9' is biased by transistor Q8'. It was found, after extensive investigation, that in the FIG. 1 circuit, there was a feedback loop indicated by chain dotted lines 12. This feed back loop existed from the base of transistor Q8', through the base-collector circuit of transistor Q9', through resistor R6' and the base-collector circuit of transistor Q3', and back to transistor Q8. The feedback loop was positive under most frequencey and gain combinations, and thus contributed to amplifier instability. By biasing transistor Q9 separately, the feedback loop 12 was broken.

It will be appreciated that although the bias sources Q8 and Q11 in the FIG. 2 circuit are separate, they are commonly referenced to transistor Q1. Transistor Q1, with resistors R1, R3, sets all the d.c. currents in the amplifier. In fact, the d.c. currents in transistors Q2, Q3, Q4, Q5, Q7, Q8, Q9, Q10, Q11, Q12 are all set by that in transistor Q1. However, the reference source, transistor Q1, is isolated from the AC signal by large impedances, so the current sources Q7 and Q9 are independent from an AC point of view. The bias sources Q8, Q11 are also independent from an AC point of view. The term "separate" is used to describe this isolation of the bias sources Q8, Q11 from each other from an AC point of view.

The separate biasing of transistor Q9 permits the addition of a self starting circuit in the FIG. 2 amplifier. The self starting circuit is formed by connecting the junction of resistor R3 and transistor Q1 to the base of a new transistor Q12. The collector-emitter circuit of transistor Q12 is connected in series with diode connected transistor Q11 across the voltage supply. With this arrangement, when power is applied to the circuit, current flows through transistor Q1, causing current to flow through transistor Q12 in the ratio of the emitter areas of transistors Q1 and Q12. When transistor Q12 turns on, transistor Q11 turns on, thus turning on current source Q9 and increasing the voltage at point A. The increased voltage at point A turns on transistor Q3, biasing transistor Q8 which turns on current source transistor Q7, starting transistor Q2.

The self starting circuit of FIG. 2 permits elimination of the external starting resistor $R_s$ of FIG. 1, which was previously needed to start operation of the current sources in that circuit. The elimination of resistor $R_s$ has several advantages. Firstly, it was found that a feedback loop, indicated by chain dotted lines 16, existed through resistor $R_s$. Feedback loop 16 was essentially the normal negative feedback loop, but with a diversion through resistor R5' and resistor $R_s$ to the base of transistor Q2'. Feedback loop 16 was positive under most frequency and gain combinations. This contributed to amplifier instability, although only to a very limited extent in the FIG. 1 circuit, since capacitor C2' acted practically as an AC short circuit of loop 16 to ground. However, if a feedback gain control resistance was to be used in the FIG. 1 circuit, to control the gain by varying the negative feedback to the base of transistor Q3', such gain control resistance had to be connected in series with capacitor C2' between point 17 in FIG. 1 and R5'. Resistance between point 17 and capacitor C2' prevented capacitor C2' from reducing the gain of feedback loop 16, which then contributes to amplifier instability. Removal of resistor $R_s$ eliminated this problem by ensuring that the bases of transistors Q2, Q3 were substantially isolated from direct AC connection with each other. (The term "direct AC connection" between two points means a connection in which AC signal from one point, e.g., the base of transistor Q3, can reach the other point, e.g., the base of transistor Q2, without substantial change in phase.)

Secondly, the elimination of starting resistor $R_s$ removed certain constraints on the input impedance of the amplifier. It is desirable that a hearing aid amplifier have a high input impedance, because if the input impedance is not high in relation to the output impedance of the transducer used in a hearing aid, then considerable signal attentuation occurs. The output impedance of a typical hearing aid transducer is 3.3K, and if the amplifier input impedance were 7K, then approximately 30 percent attenuation of the input signal would result, requiring greater amplifier gain. The input impedance in the FIGS. 1 and 2 circuits is approximately the value of resistor R2, which in the FIG. 1 circuit is 7K. In the FIG. 1 circuit the value of resistor R2 was limited by the requirement that the voltage drop across the series connection of resistor R2 and $R_s$ not be so large as to prevent starting of transistor Q3. In the FIG. 2 circuit, since the need for resistor $R_s$ has been eliminated, resistor R2 can be increased in value as required and a value of 27K has been selected, almost quadrupling the input impedance of the amplifier. Resistor R2 will usually have a value of at least 20K in the FIG. 2 circuit.

In addition, the elimination of starting resistor $R_s$ reduced the external component count for the amplifier, an important consideration in applications such as hearing aids.

Concerning the frequency compensation elements R9 and C3, it was found during development of the FIG. 2 circuit that there were some 37 poles and zeros in the circuit, each contributing a frequency varying phase shift of up to 90°. This resulted in formidable instability problems, since whenever the total phase shift was 180 degress with an amplifier loop gain greater than one, oscillations would occur (and in fact occurred frequently). However, it was found that by introducing frequency compensation elements at one particular location, namely in the base-collector circuit of transistor Q5, the instability could be overcome. The capacitor C3 is chosen to roll off the high frequency response of the amplifier in such a way as to provide stable feeback operation with sufficient bandwidth (for hearing aid use, a bandwidth of 150 to 8K Hz is usually adequate). The collector-base connection of capacitor C3 utilizes the Miller effect to increase the effective value of the capacitance, and hence capacitor C3 is small enough to integrate with present silicon technology. This further reduces the external component count, an important feature for hearing aid amplifiers.

Figure 3:
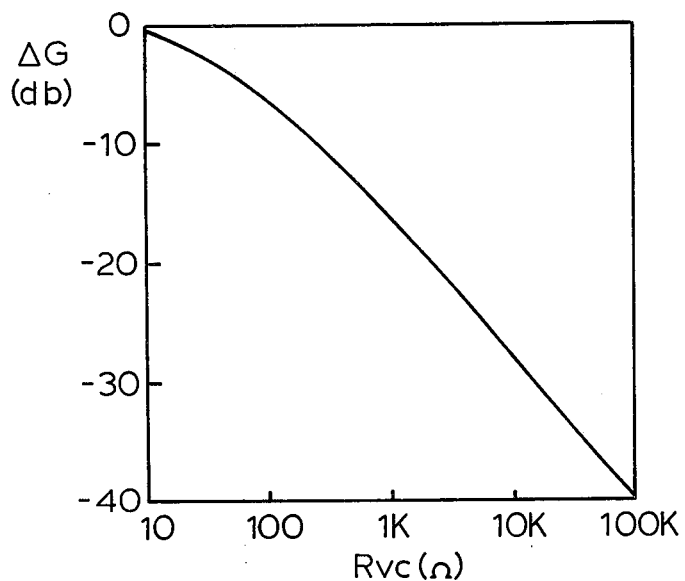
FIG. 3 shows the gain of the FIG. 2 circuit plotted against values of its gain control resistor.

With the two feedback loops 12, 16 of the FIG. 1 circuit broken, and with the frequency compensation elements R9, C3 in place, it was found that a feedback type gain control could be used in the FIG. 2 circuit. The control is provided by resistor $R_{vc}$, which is connected in series with capacitor C2 and resistor R5 to the base of transistor Q3. As the resistance of resistor $R_{vc}$ is lowered, negative feedback to the base of transistor Q3 is attenuated, increasing the net gain of the amplifier. It is found that as resistor $R_{vc}$ is varied between 10 ohms and 100K, a nearly inversely proportional change in gain occurs, as shown in FIG. 3. The feedback type of gain control is highly desirable, since it permits a wide range gain control without affecting the ability to deliver maximum power output at low distortion. In the FIG. 1 circuit, the gain control which was normally used was an attenuation control (a divider was placed in the signal path), and this upset the d.c. conditions and reduced the maximum power available at low distortion. In some cases a feedback type gain control was employed in the FIG. 1 circuit, by placing a 100K variable resistor between capacitors C2 and C3, but this upset the d.c. conditions drastically, and large distortion occurred with only moderate attenuation.

A further difference between the FIGS. 1 and 2 circuits is that in the FIG. 2 circuit, current source transistor Q10 is a lateral pnp transistor and transistor Q5 is a vertical npn transistor (both n-type epitaxy). In the FIG. 1 circuit, transistor Q5' is a pnp transistor and current source transistor Q10' is an npn transistor. The difference is that the current gain of the vertical npn device is much higher than that of a lateral pnp device. Typical values are beta = 150 for the vertical npn device as compared with 30 for the lateral pnp device. As a result, the voltage gain of transistor Q2 in stage 4 is increased two to five times. The open loop gain of the FIG. 2 amplifier is therefore much higher than that of the FIG. 1 amplifier, resulting in a closed loop gain that is less dependent on supply voltage or device parameters.

A still further difference between the two circuits is that the d.c. potential at the top of resistor R7 has been lowered from about 80 millivolts in the FIG. 1 circuit to about 40 millivolts in the FIG. 2 circuit. In the FIG. 1 circuit the 80 millivolt level is set by resistor R3'. In the FIG. 2 circuit, the voltage drop across resistors R7 and R8 combined is 80 millivolts, but because part of resistor R7 has in effect been transferred into resistor R8, the voltage drop across resistor R7 has been reduced. Therefore, when transistor Q6 is driven hard, the saturation voltage at the collector is lowered by about 80 millivolts when when compared with that of transistor Q6' in the FIG. 1 circuit. This increases the range of distortion free operation. The maximum output swing is typically increased by 160 millivolts and maximum output power is increased by 13% for Vcc = 1.55 volts.

It is found that the circuit of FIG. 2 will produce a closed loop gain of approximately 72 db with minimum external components, and that the volume control range is typically about 42 db and varies almost inversely with variation in the value of resistor $R_{vc}$. Because of the high input impedance, the FIG. 2 circuit operates well with hearing aid transducers, and is also suitable for use with 500 to 5000 ohm loads. Because of the stability built into the circuit, and the self starting circuit, it is relatively insensitive to variations in both battery voltage and resistance, and will typically operate over a battery voltage range of 1.0 to 1.6 volts.

It is emphasized that the design of a circuit according to the invention is extremely critical. In view of the some 37 poles and zeros which the circuit possesses, each of which contributes a phase shift which varies with frequency, even minor changes in circuit configuration have been found to result in instability. Appropriate changes may of course be made in component values depending on the application and on the characteristics of the input transducer and load, and the value of resistor R7 will be chosen to provide an appropriate output bias current depending upon the load. However, it has been found essential to bias the current source transistors Q9 and Q10 separately from the current source transistor Q7; this breaks at least the feedback loop 12 previously mentioned and also enables provision of a simple integrated self starting circuit for the amplifier. It has also been found essential to connect the frequency compensation elements to the input of transistor Q5; any other location, as mentioned, results in instability.

Figure 4:
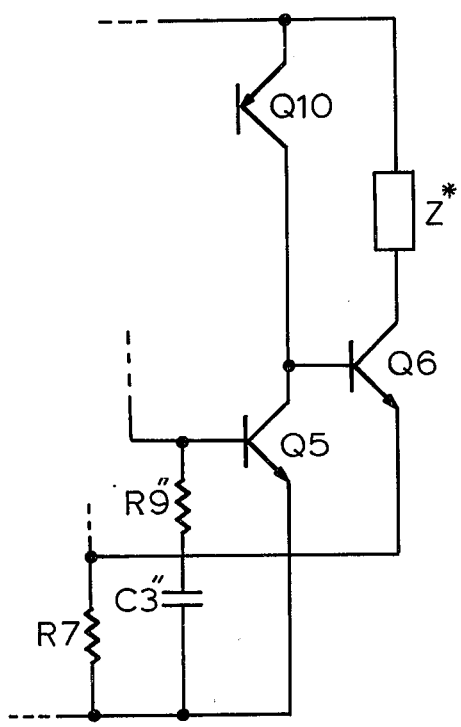
FIG. 4 shows a portion of the FIG. 2 circuit with modified frequency compensation elements.

If desired, and as shown in FIG. 4, the frequency compensation elements, indicated at R9" and C3", may be placed between the base of transistor Q5 and ground. This is less desirable than the arrangement shown in the FIG. 2 circuit, because capacitor C" will probably be too large to integrate with present technology. However, the FIG. 4 arrangement will still provide adequate compensation while retaining the stability of the FIG. 2 circuit, because the driving source (transistor Q2) still "sees" the rolling off impedance. In the FIG. 1 circuit; frequency compensation (by means of capacitor C3') was provided at the base of transistor Q6', but it has been discovered that transistor Q5 provides a dominant pole in the circuit and that frequency compensation must occur at the input to this transistor if the circuit is to be stable.

Figure 5:
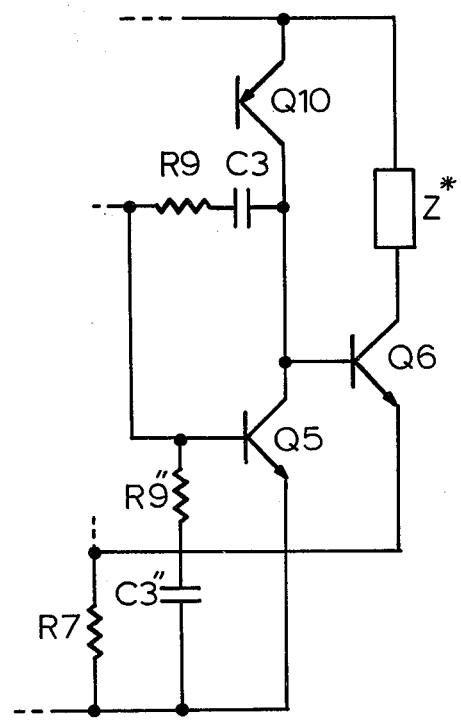
FIG. 5 shows a portion of the FIG. 2 circuit with further modified frequency compensation elements.

As shown in FIG. 5, frequency compensation may also be provided by a combination of resistor R9 and capacitor C3 connected between the base and collector of transistor Q5, and resistor R9" and capacitor C3" connected between the base of transistor Q5 and ground.

Figure 6:
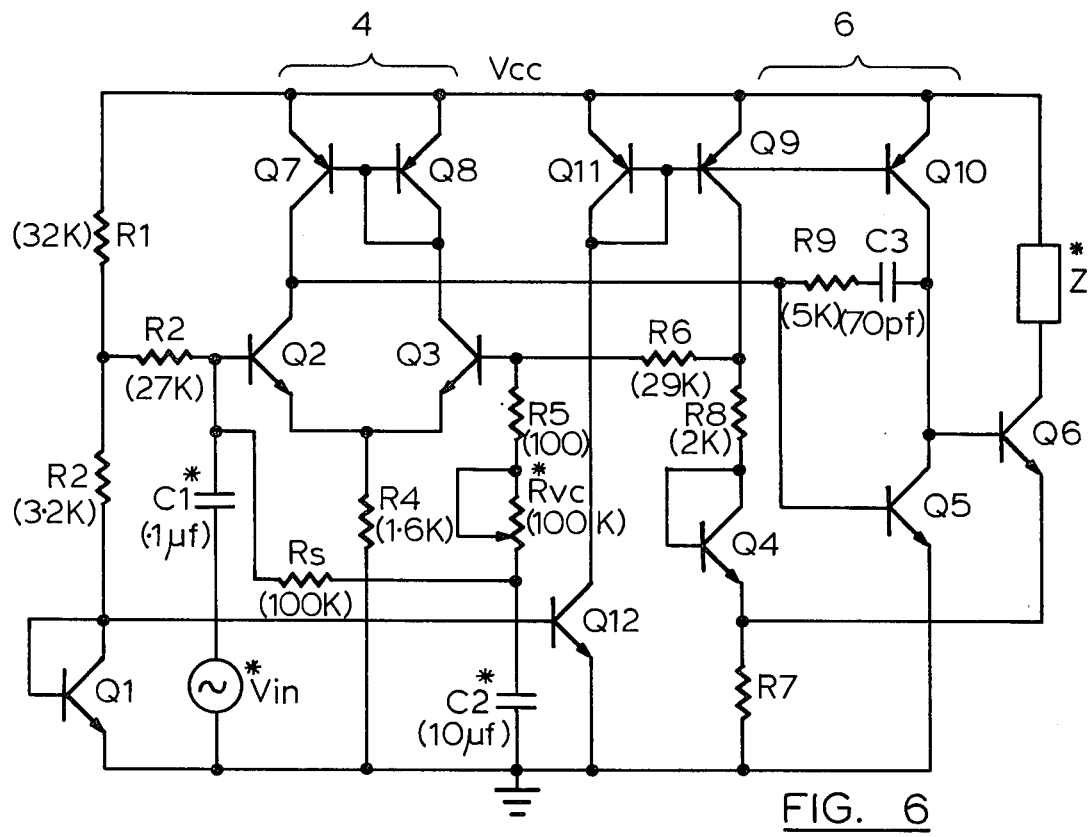
FIG. 6 shows the FIG. 2 circuit with an additional starting resistor therein and with the position of the gain control resistor altered.

If desired, certain other changes can be made in the FIG. 2 circuit. For example, transistor Q12 and the lead connecting it to transistor Q1 can be eliminated, and transistor Q12 can be replaced by a simple resistor in series with transistor Q11. However, the arrangement shown is preferred. In addition, resistor $R_s$ can be reinserted, as shown in FIG. 6, so long as capacitor C2 is connected to create an AC short circuit between the feedback loop 16 and ground. When resistor $R_s$ is used, as in the FIG. 6 circuit, it contributes to the starting of transistor Q3. So long as there is no significant resistance in the capacitive connection C2, between feedback loop 16 and ground, the gain in feedback loop 16 remains so low the tendency of this loop to create instability is very limited. So long as resistor $R_s$ is not variable, it can be integrated, although with some difficulty in view of its large resistance. However, again the FIG. 2 circuit is preferred, since the addition of resistor $R_s$ in the FIG. 6 circuit is not needed for circuit operation, and resistor $R_s$ does constitute an added component and one which can contribute to instability if the impedance of capacitor C2 and its leads are not kept low. In addition, the presence of resistor $R_s$ adds a constraint on the value of resistor R2.

Figure 7:
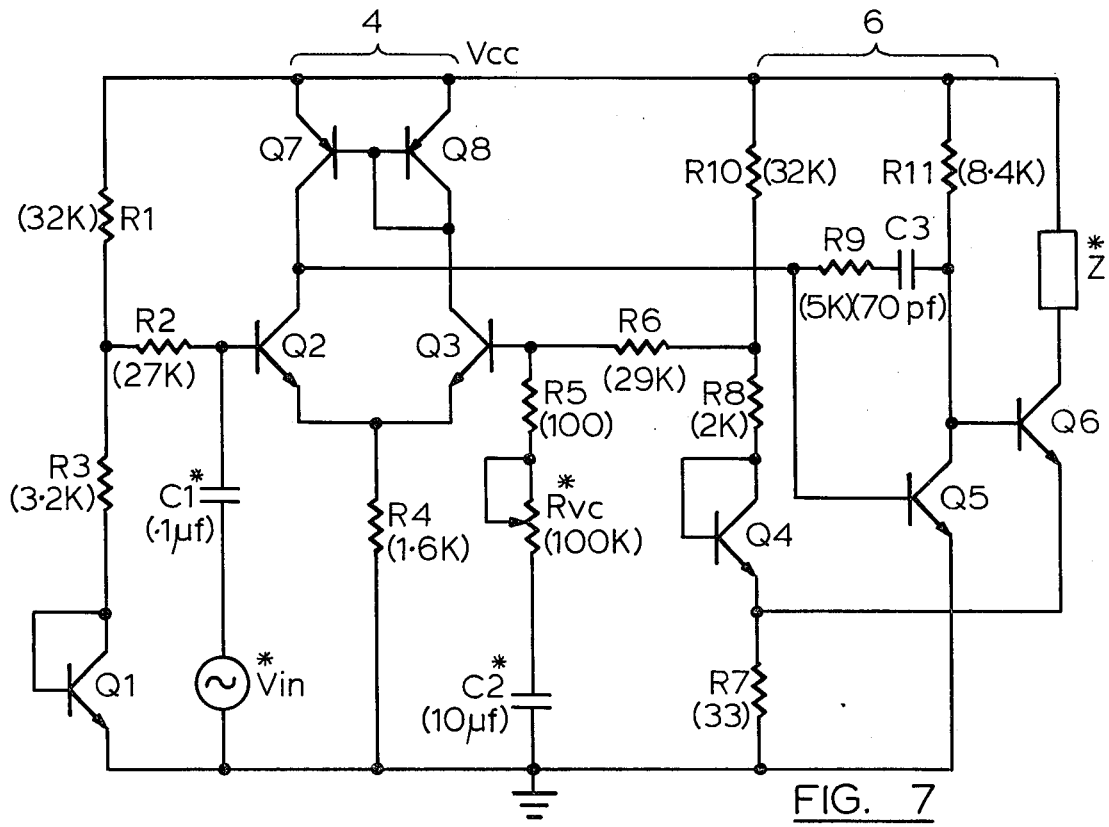
FIG. 7 shows a modification of the FIG. 2 circuit.

A further change that may be made is that current sources Q9, Q10 may be replaced by resistors R10, R11 respectively, as shown in FIG. 7. The resistors R10, R11 act as high impedance loads in place of the current sources, and do not require biasing. The circuit of FIG. 7 is identical with that of FIG. 2 except for this change, and also except that of course the bias source Q11 has been removed together with its starting transistor Q12. The circuit of FIG. 7 is still self starting, and the positive feedback loops shown in FIG. 1 have still been eliminated, and it still possesses proper frequency compensation for stable operation. However, the FIG. 2 circuit is still preferred, because it has slightly more open loop gain, it uses less chip area (since the resistors R10, R11 occupy considerable area), and the FIG. 7 circuit would use even more chip area in lower circuit versions where the resistors R10, R11 must be larger.

What we claim as our invention is:

1. An integrated circuit direct coupled amplifier adapted to operate from a single battery cell and having no more than a single base-emitter junction in series across said cell, said amplifier comprising:
   a. a first connection adapted to be connected to one side of said cell and a second connection adapted to be connected to the other side of said cell,
   b. a differential stage having first and second NPN transistors, each having a base, an emitter and a collector, the emitters of said first and second transistors being connected together,
   c. an amplifying stage comprising a third NPN transistor having a base, an emitter and a collector,
   d. an output stage comprising a fourth NPN transistor having a base, an emitter and a collector,
   e. an input bias circuit for said first transistor, said input bias circuit comprising a first resistance having one side connected to said base of said first transistor and having a second side, a second resistance connected between said second side of said first resistance and said first connection, a fifth NPN transistor having a base, an emitter and a collector, a third resistance, said third resistance and the emitter and collector of said fifth transistor being connected in series between said second side of said first resistance and said second connection, the base and collector of said fifth transistor being connected together,
   f. means connected to said base of said first transistor for receiving a signal to be amplified,
   g. current conducting means connecting the emitters of said first and second transistors to said second connection,
   h. a first current source load connected to said output means of said first transistor, said first current source load being a sixth PNP transistor having a base, an emitter and a collector, the emitter of said sixth transistor being connected to said first connection and the collector of said sixth transistor being connected to the collector of said first transistor,
   i. first bias means biasing said sixth transistor, said first bias means being a seventh PNP transistor having a base, an emitter and a collector, the emitter of said seventh transistor being connected to said first connection and the collector of said seventh transistor being connected to the collector of said second transistor, the base and collector of said seventh transistor being connected together,
   j. said collector of said first transistor being connected to said base of said third transistor,
   k. a second current source load, separate from said first current source load, connected to said collector of said third transistor and operative when power is supplied from said battery cell to said first and second connections,
   l. said collector of said third transistor being connected to said base of said fourth transistor,
   m. negative feedback means for feeding back a portion of the signal from the emitter of said fourth transistor to said base of said second transistor, said negative feedback means comprising:
      i. a series connection comprising: an eighth NPN transistor having a base, an emitter and a collector, the base and collector of said eighth transistor being connected together, and a fourth resistance connected in series with said eighth transistor,
      ii. one side of said series connection being connected to the emitter of said fourth transistor,
      iii. a fifth resistance connected between said one side of said series connection and said second connection for shifting the d.c. level of the feedback signal,
      iv. a third current source load, separate from said first current source load, having one side connected to said first connection and having a second side connected to the other side of said series connection,
      v. and a sixth resistance connected between the base of said second transistor and said second side of said third current source load, said third current source load being operative when power is supplied from said battery cell to said first and second connections,
   n. frequency compensation means connected to the base of said third transistor, to stablize said amplifier, said compensation means comprising a series resistance and capacitance,
   o. the base of said second transistor being substantially isolated from direct AC connection with the base of said first transistor,
   and feedback attenuation means, including a second capacitance and a feedback attenuation resistance, connected in series between the base of said second transistor and said second connection.

2. An amplifier according to claim 1, wherein said first resistance has a resistance greater than 20,000 ohms.

3. An amplifier according to claim 1, wherein said feedback attenuation resistor is a variable resistor for varying the negative feedback to said differential amplifier.

4. An amplifier according to claim 1, wherein said frequency compensation means is connected between the base and collector of said third transistor.

5. An amplifier according to claim 1, wherein said third current source load is a resistor.

6. An amplifier according to claim 1, wherein said second and third current source loads are respectively ninth and tenth PNP transistors each having a base, an emitter and a collector, the emitters of said ninth and tenth transistors being connected to said first connection, the collector of said ninth transistor being connected to the collector of said third transistor, the collector of said tenth transistor being said second side of said third current source, and a bias means for said ninth and tenth transistors, said bias means comprising an eleventh PNP transistor having a base, an emitter and a collector, the emitter of said eleventh transistor being connected to said first connection, the collector and base of said eleventh transistor being connected together and to the bases of said ninth and tenth transistors, and further current conducting means connecting the collector of said eleventh transistor to said second connection.

7. An amplifier according to claim 6, wherein said further current conducting means is a twelfth NPN transistor having a base, an emitter and a collector, the base of said twelfth transistor being connected to the collector of said fifth transistor, the collector of said twelfth transistor being connected to the collector of said eleventh transistor, and the emitter of said twelfth transistor being connected to said second connection.

* * * * *